United States Patent
Tang et al.

(10) Patent No.: US 9,971,862 B2
(45) Date of Patent: May 15, 2018

(54) PATTERN-BASED FPGA LOGIC BLOCK AND CLUSTERING ALGORITHM

(71) Applicant: ECOLE POLYTECHNIQUE FEDERALE DE LAUSANNE (EPFL), Lausanne (CH)

(72) Inventors: Xifan Tang, Lausanne (CH); Pierre-Emmanuel Julien Marc Gaillardon, Renens (CH); Giovanni De Micheli, Lausanne (CH)

(73) Assignee: Ecole Polytechnique Fédérale de Lausanne (EPFL), Lausanne (CH)

( * ) Notice: Subject to any disclaimer, the term of this patent is extended or adjusted under 35 U.S.C. 154(b) by 17 days.

(21) Appl. No.: 14/808,506

(22) Filed: Jul. 24, 2015

(65) Prior Publication Data

US 2016/0063168 A1 Mar. 3, 2016

Related U.S. Application Data

(60) Provisional application No. 62/041,716, filed on Aug. 26, 2014.

(51) Int. Cl.
*G06F 17/50* (2006.01)

(52) U.S. Cl.
CPC ...... *G06F 17/5077* (2013.01); *G06F 17/5054* (2013.01)

(58) Field of Classification Search
CPC ............ G06F 17/5045; G06F 17/5054; G06F 17/5077

(Continued)

(56) References Cited

U.S. PATENT DOCUMENTS

| 6,725,442 B1 * | 4/2004 | Cote | G01B 31/318519 |
| | | | 716/100 |
| 7,725,867 B2 * | 5/2010 | Gude | H03K 19/1737 |
| | | | 716/128 |

(Continued)

OTHER PUBLICATIONS

D. Lewis, V. Betz, D. Jefferson, and et al, *The Stratix TM Routing and Logic Architecture*, ACM/SIGDA International Symposium on FPGAs, 2003, pp. 12-20.s.

(Continued)

*Primary Examiner* — Paul Dinh
(74) *Attorney, Agent, or Firm* — Nixon & Vanderhye P.C.

(57) ABSTRACT

A routing architecture for fast interconnections between Look-Up Tables (LUTs) in a group of Basic Logic Elements (BLEs), whereby a size of the group ranges from 1 to k+1, where k is the number of inputs of a LUT, and LUTs in the group are indexed from 1 to k+1, and whereby (a) an output of a $LUT_i$, $1 \leq i \leq k$, connects to one of the inputs of routing multiplexers of $LUT_j$, $i < j \leq k+1$, hence creating a fast interconnection between LUTs, each routing multiplexer of $LUT_m$, $2 \leq m \leq k+1$, has only one input that is connected to the output of an other LUT, the output of $LUT_{(k+1)}$ being devoid of any connection to any one of the inputs of the routing multiplexers; (b) a subset of the inputs of $LUT_1$ are connected to the outputs of other LUTs by means of fast interconnections, leaving the remaining inputs of $LUT_1$ free of any fast interconnection, whereby for $LUT_p$, $2 \leq p \leq k+1$, $p-1$ inputs of the $LUT_p$ are connected to the outputs of $LUT_q$, $1 \leq q \leq j$, by means of fast interconnections; and (c) a cluster-based logic block contains at least one group of LUTs.

7 Claims, 4 Drawing Sheets

(58) Field of Classification Search
USPC .............. 326/38, 40–41; 716/100, 126, 128; 320/40
See application file for complete search history.

(56) References Cited

U.S. PATENT DOCUMENTS

| | | | | |
|---|---|---|---|---|
| 7,924,053 | B1* | 4/2011 | Kaptanoglu | H03K 19/177 326/41 |
| 2007/0164785 | A1* | 7/2007 | He | G06F 17/5054 326/41 |
| 2009/0167349 | A1* | 7/2009 | Madurawe | H03K 19/1736 326/40 |
| 2009/0243652 | A1* | 10/2009 | Dorairaj | G11C 7/1006 326/38 |
| 2013/0093460 | A1* | 4/2013 | Voogel | H03K 19/17744 326/38 |

OTHER PUBLICATIONS

K. Wang, M. Yang, L. Wang, X. Zhou, and J. Tong, *A Novel Packing Algorithm for Sparse Crossbar FPGA Architectures*, International Conf. on Solid-State and Integrated-Circuit Technology, 2008, pp. 2345-2348.

G. Ni, J. Tong and J. Lai, *A New FPGA Packing Algorithm Based on the Modeling Method for Logic Block*, IEEE International Conf. on ASICs, 2005, pp. 877-880.

E. Ahmed, J. Rose, *The Effect of LUT and Cluster Size on Deep-Submicron FPGA Performance and Density*, IEEE Transactions on Very Large Scale Integration (VLSI) Systems, vol. 12, No. 3, 2004, pp. 288-298.

V. Betz and J. Rose, *Cluster-Based Logic Blocks for FPGAs: Area-Efficiency vs. Input Sharing and Size*, IEEE Custom Integrated Circuits Conf., 1997, pp. 551-554.

A. Marquardt, V. Betz, and J. Rose, *Using Cluster-Based Logic Blocks and Timing-Driven Packing to Improve FPGA Speed and Density*, ACM/SIGDA International Symp. on FPGAs, 1999, pp. 37-46.

E. Bozorgzadeh, S. Memik, X. Yang, and M. Sarrafzadeh, *Routability-driven Packing: Metrics and Algorithms for Cluster-Based FPGAs*, Journal of Circuits Systems and Computers, vol. 13, No. 1, 2004, pp. 77-100.

A. Singh, G. Parthasarathy, and M. Marek-Sadowksa, *Efficient Circuit Clustering for Area and Power Reduction in FPGAs*, ACM Trans. on Design Automation of Electronic Systems, vol. 7, No. 4, 2002, pp. 643-663.

G. Karypis and V. Kumar, *Multilevel K-Way Hypergraph Partitioning*, DAC, 1999, pp. 343-348.

D. Chen, K. Vorwerk, and A. Kennings, *Improving Timing-Driven FPGA Packing with Physical Information*, International Conf. on Field Programmable Logic and Applications, 2007, pp. 117-123.

J. Rose, J. Luu, C.-W. Yu, O. Densmore, J. Goerders, A. Somerville, K.B. Kent, P. Jamieson and J. Anderson, *The VTR Project: Architecture and CAD for FPGAs from Verilog to Routing*, ACM/SIGDA International Symposium on FPGAs, Feb. 2012, pp. 77-86.

J. Luu, J. Rose, J. Anderson, *Towards Interconnect-Adaptive Packing for FPGAs*, ACM/SIGDA International Symposium on FPGAs, 2014, pp. 21-30.

J. Luu, J. Anderson, and J. Rose, *Architecture Description and Packing for Logic Blocks with Hierarchy, Modes and Complex Interconnect*, ACM/SIGDA International Symposium on FPGA, 2011, pp. 227-236.

G. Lemieux, E. Lee, M. Tom, A. Yu, *Directional amd Single-Driver Wires in FPGA interconnect*, IEEE International Conference on Field Programmable Technology, 2004, pp. 41-48.

S. Yang, *Logic Synthesis and Optimization Benchmarks User Guide Version 3.0*, MCNC, Jan. 1991.

W. Feng, *K-way Partitioning Based Packing for FPGA Logic Blocks without Input Bandwidth Constraint*, Int'l Conf. on Field Programmable Technology, 2012, pp. 8-15.

\* cited by examiner

PATTERN-BASED FPGA LOGIC BLOCK AND CLUSTERING ALGORITHM

The present application claims priority from U.S. provisional patent application having the Ser. No. 62/041,716, filed on Aug. 26, 2014, which is incorporated herein by reference.

TECHNICAL FIELD

The invention is in the field of Field Programmable Gate Array (FPGA) architectures.

I. Prior Art

Field Programmable Gate Arrays (FPGAs) are highly customizable digital circuits and represent a viable and economical solution in Non-Recurring Engineering (NRE), as compared to Application Specific Integrated Circuits (ASICs). To ensure a high programmability level, modern FPGA architectures use cluster-based logic blocks, composed of a number of Basic Logic Elements (BLEs) [1]. Inside logic blocks, BLEs are fully connected by local routing multiplexers. To improve the efficiency of logic blocks, previous works [2] [3] [4] focused on de-populated local routing multiplexers. However, very limited works investigate the efficiency of BLEs.

A Basic Logic Element (BLE), consists of a Look-Up Table (LUT), a D Flip-Flop (DFF), and a 2:1 multiplexer. It can work in either combinational or sequential mode. FPGA clustering algorithms pre-pack LUTs and DFFs into BLEs and then group BLEs into logic blocks [1]. A BLE has only one fanout, which forces combinational output of LUTs to pass through the 2:1 multiplexer before reaching the local routing. This imposes strong limitations on the clustering algorithm during the pre-packing. In circuits with short critical paths, for example control-intensive circuits, the BLE architecture prolongs the critical path and reduces the performances significantly.

The present patent application aims at proposing
  (i) a novel scalable logic block organization called pattern-based logic block. Based on the cluster-based logic block architecture, we investigate the different interconnection patterns that may exist between LUTs. We then realize a hardware support for those patterns by creating groups of LUTs with fast combinational shortcuts. To fully unlock the performances of the new logic block structure, we introduce
  (ii) a pattern-based clustering algorithm, able to efficiently take advantage of the fast combinational paths. Joint efforts of pattern-based logic block and clustering algorithm contribute to a 16% performance gain, an 8% wire length reduction with a 3% area overhead compared to a conventional FPGA architecture at 40 nm technology node for a set of large control-intensive benchmarks.

SUMMARY OF INVENTION

In a first aspect, the invention provides a routing architecture for fast interconnections between Look-Up Tables (LUTs) in a group of Basic Logic Elements (BLEs), whereby a size of the group ranges from 1 to k+1, where k is the number of inputs of a LUT, and LUTs in the group are indexed from 1 to k+1, and whereby
  (a) an output of a $LUT_i$, $1 \leq i \leq k$, connects to one of the inputs of routing multiplexers of $LUT_j$, $i < j \leq k+1$, hence creating a fast interconnection between LUTs, each routing multiplexer of $LUT_m$, $2 \leq m \leq k+1$, has only one input that is connected to the output of an other LUT, the output of $LUT_{(k+1)}$ being devoid of any connection to any one of the inputs of the routing multiplexers;
  (b) a subset of the inputs of $LUT_1$ are connected to the outputs of other LUTs by means of fast interconnections, leaving the remaining inputs of $LUT_1$ free of any fast interconnection, whereby for $LUT_p$, $2 \leq p \leq k+1$, p−1 inputs of the $LUT_p$ are connected to the outputs of $LUT_q$, $1 \leq q \leq j$, by means of fast interconnections;
  (c) a cluster-based logic block contains at least one group of LUTs.

In a preferred embodiment, all the inputs of the $LUT_{k+1}$ are connected to the outputs of $LUT_n$, $1 \leq n \leq k$, by means of fast interconnections.

In a further preferred embodiment, the fast interconnections between LUTs are implemented by multiplexers.

In a further preferred embodiment, the fast interconnections are arranged to create a layer comprising 2:1 multiplexers between the existing local routing architecture and LUT inputs; one of the inputs of the 2:1 multiplexers is connected to the output of a LUT; an other of the inputs of the 2:1 multiplexer is connected to an output of the local routing architecture. Additional memory bits are comprised for the 2:1 multiplexers, thereby producing an area overhead.

In a further preferred embodiment, the fast interconnections are arranged to be merged into the local routing architecture; the size of at least one of the multiplexers in the local routing architecture is increased by 1 for the fast interconnections; and the output of the at least one multiplexers are respectively connected to pre-determined LUT inputs by means of a fast interconnection.

In a second aspect, the invention provides a method of clustering algorithm suitable for exploiting the routing architecture described herein above, which packs Look-Up Tables (LUTs) of the routing architecture into logic blocks according to at least the following steps:
  (a) in a pre-pack stage, add additional LUTs working as buffer, only for the LUTs whose fanouts are larger than the size of LUT groups;
  (b) instantiate an empty logic block;
  (c) find candidate groups of LUTs that the logic block is enabled to accommodate;
  (d) select a best fit group of LUTs by calculating a cost function's attraction;
  (e) place the candidate groups of LUTs identified in the step of finding candidate groups, in a logic block;
  (f) cause a router to check if nets are mapped into the routing architecture, and
    (i) if a net is mapped, run step (c) iteratively until the logic block is full or there is no candidate group, and
    (ii) if a net fails to be mapped, record the failure, run step (c) to try an other candidate;
  (g) when the current logic block is full, start from step (b) with a new empty logic block, unless all the LUTs are packed.

BRIEF DESCRIPTION OF THE FIGURES

The invention will be better understood in view of the detailed description of preferred embodiments and in reference to the drawings, wherein.

DETAILED DESCRIPTION OF PREFERRED EMBODIMENTS

II. Background In this section, the classical cluster-based logic block architecture and clustering algorithms are reviewed.

A. Classical Cluster-Based Logic Block

Figure 1:
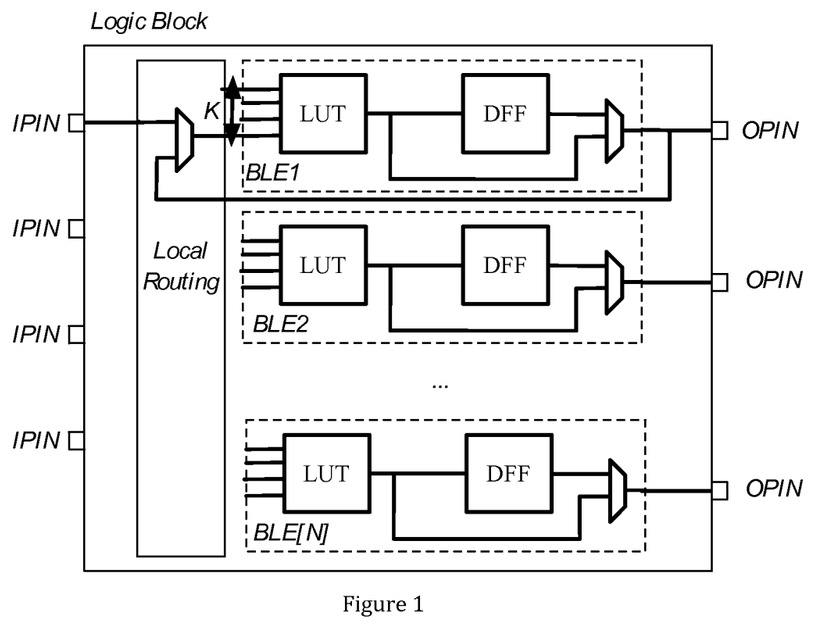
FIG. 1 illustrates the architecture of a classical cluster-based logic block according to prior art.

Modern FPGAs use an island-style architecture, where logic blocks are surrounded by pre-fabricated routing resources. The logic block themselves are composed of Basic Logic Elements (BLEs) and a fully interconnected local routing [1]. FIG. 1 illustrates the architecture of a classical cluster-based logic block. A cluster-based logic block consists of a number N of BLEs. Each BLE contains a k-input LUT, a DFF and a 2:1 multiplexer. A BLE realizes fine-grain combinational or sequential operations. Its mode of operation (combinational or sequential) is controlled by the 2:1 multiplexer. Local routing, composed of a large set of multiplexers, can route any outputs of BLEs to their inputs, enhancing the inner logic block routability. The logic block features I inputs that come from the global routing. Given k and N, setting I=k(N+1)/2 ensures that 98% BLEs are utilized on average [5]. To efficiently pack LUTs and DFFs into cluster-based logic block, clustering algorithms are of fundamental importance.

B. Clustering Algorithm

Modern FPGA clustering algorithms can be grouped into two categories: seed-based and partition-based. Seed-based clustering algorithms select a seed BLE with the highest criticality, pack it into a logic block and continue to absorb BLEs until the logic block cannot accommodate any more. Different seed-based packers use different criticality and attraction functions to achieve diverse objective efficiencies. VPack [6] aims to absorb as much nets as possible. T-VPack [7] adds critical path optimization. To improve routability, T-RPack [8] and iRAC [9] absorb low-fanout nets. Partition-based clustering algorithm, such as PPack [10] and T-PPack [10] depends on a graph partitioner [11] to cut the circuits into small parts and then modify the results to fit CLB capacity. HD-Pack [12] carries out seed-based clustering algorithm after a virtual placement with graph partitioner. Nevertheless, the above packers only support classical logic blocks [1]. Developed for general purpose packing, AA-Pack [14] adapts the techniques used in HD-Pack, iRAC and TV-Pack to pack heterogeneous logic blocks and supports flexible local routing architectures inside the logic blocks, bringing novel opportunities to study the inner logic block routing. Therefore, we focus on introducing AA-Pack.

Figure 2:
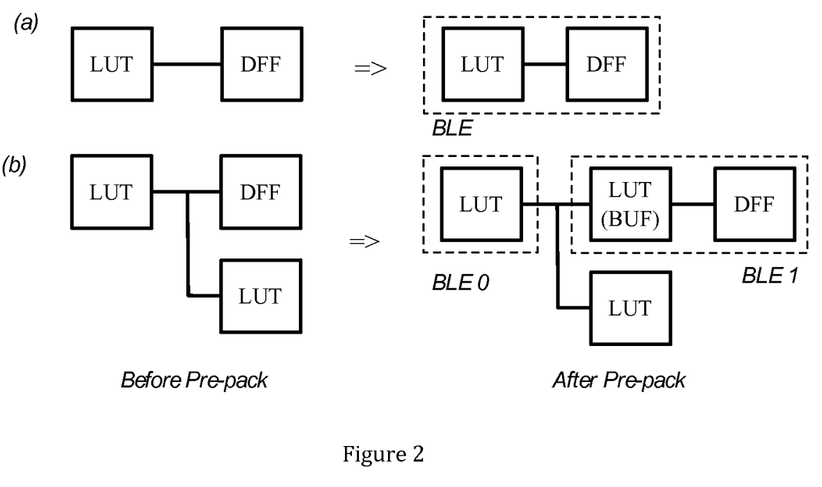
FIG. 2 illustrates a step of pre-pack according to prior art, wherein LUTs and DFFs are packed into BLEs.

AA-Pack groups LUTs and DFFs into logic blocks in two steps. In the first step, called pre-pack, LUTs and DFFs are packed into BLEs, as shown in FIG. 2. Note that in FIG. 2(b), an additional BLE has to be created due to the limited fanout of the BLE architecture [1]. In combinational mode, the pre-packing step increases the critical path. Indeed, the LUT output has to pass through the 2:1 multiplexer before reaching the local routing, while additional LUTs may be inserted to accommodate large fanouts. In circuits with short critical path, for instance control-intensive circuits, the critical path can be prolonged significantly. After pre-pack, timing analysis is carried out and timing slacks are marked for each BLE, preparing for timing-driven clustering. AA-Pack 7.0 con- ducts accurate timing-analysis by considering the architecture physical information and modeling the inner-cluster delay and inter-cluster delay. In the second step, AA-Pack pack BLEs into logic blocks. It starts by initializing an empty logic block, then chooses a seed and uses an attraction function to select the candidate block, B, to fill in. The attraction function is composed of two parts:

$$\text{Attraction} = \alpha \cdot \text{timing\_criticality}(B) + (1-\alpha) \cdot \text{area\_attraction}(B) \qquad (1)$$

The first part is used in TV-Pack [7] as criticality and the second is the attraction function used in AA-Pack 6.0 [13]. The parameter a yields good performance [13] when sets to 0.75. When two candidates B1 and B2 have the same attraction, AA-Pack selects the one with largest number of critical/near critical paths, called PathAffects [1], passing through. If the two candidates have the same PathAffects, AA-Pack selects the one with largest depth from critical path source, called $D_{source}$[1]. In AA-Pack 7.0, each time the most "attractive" candidate is chosen, a local router is speculatively called to determine whether the candidate can be accepted. When the logic block is full, AA-Pack starts another iteration until all BLEs are packed. Besides, AA-Pack 7.0 enhances routability by intra-logic block placement, which is out of the scope of this paper, and thus not discussed.

III. Pattern-Based FPGA Logic Block

In this section, we introduce our novel pattern-based FPGA logic block architecture. Patterns are defined as groups of LUTs, among which there exist fast combinational interconnections. In the first part, we investigate the combinational interconnections among LUTs. In the second part, the new logic block architecture is presented.

A. Combinational Interconnection Patterns

To improve the routing of combinational paths, we study the different interconnection possibilities between LUTs. We first formulate the following characteristics of LUTs:

C1) all the inputs of a LUT are logic equivalent, and thus are swappable.

C2) LUTs (actually any combinational logic gate) cannot have combinational loops, which means that the interconnections among LUTs are acyclic.

C3) Any two inputs of a LUT (actually any combinational logic gate) cannot share the output of a same LUT, otherwise these shared inputs can be reduced to one.

C4) Combining C2 with C3, there should be only one combinational connection between two LUTs.

Thanks to the above characteristics, the number of combinational interconnection patterns between LUTs is limited. We define M as the size of the pattern. It corresponds to the number of LUTs involved in the pattern. Note that we limit our study to k≥M. In the following, we study the cases of pattern-2 and pattern-3, then we generalize to pattern-M.

Figure 3:
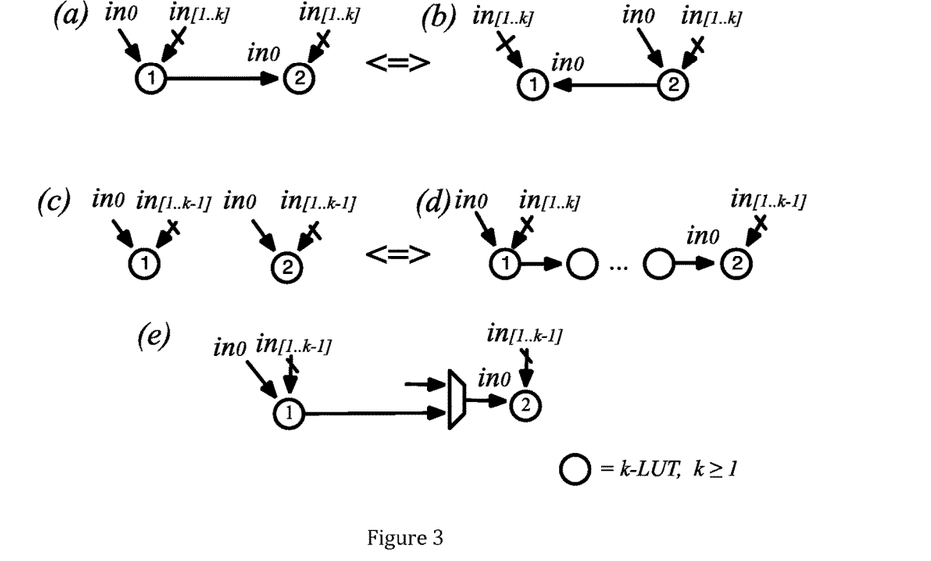
FIG. 3 illustrates all possible interconnection cases between 2 k-LUTs and demonstrates the pattern covering all possibilities.

1) Pattern-2: FIG. 3 illustrates all possible interconnection cases between two k-LUTs and demonstrates the pattern covering all possibilities. More specifically, FIGS. 3(a) and 3(b) contain 2 k-LUTs that are directly connected; FIG. 3(c) contains 2 k-LUTs that are independent, FIG.

3(d) contains 2 k-LUTs that are indirectly connected, and FIG. 3(e) contains an interconnection pattern covering (a)(b)(c)(d). Given two k-LUTs (tagged 1 and 2), only two cases can be identified for their interconnections. First, a direct connection may exist between the output of one LUT and one of the inputs of the second LUT. In FIG. 3(a), the output of LUT1 is connected to an input of LUT2. From C4, there should be only one interconnection between LUT1 and LUT2, and by applying C1, we can always keep the output of LUT 1 connected to the input in0 of LUT2. Note that when using local routing in cluster-based logic block, LUT1 and LUT2 are swappable. Thus, FIG. 3(b) can be regarded as equivalent to FIG. 3(a). Second, inputs of LUT1 and LUT2 can be fully independent as shown in FIG. 3(c). For instance, all the LUT inputs are connected to different primary inputs, LUTs or DFFs. FIG. 3(d) presents a possibility where the output of LUT1 is connected to the input of LUT2 through other LUTs. FIG. 3(c) and (d) can be regarded as equivalent because they are all connected through the local routing. Therefore, when two LUTs are considered, only two cases (FIG. 3(a) and (c)) should be considered. Hence, we can create a universal structure able to map these different configurations by adding one multiplexer as shown in FIG. 3(e). This structure is called pattern-2, and can realize all the interconnection patterns between 2 LUTs.

Figure 4:
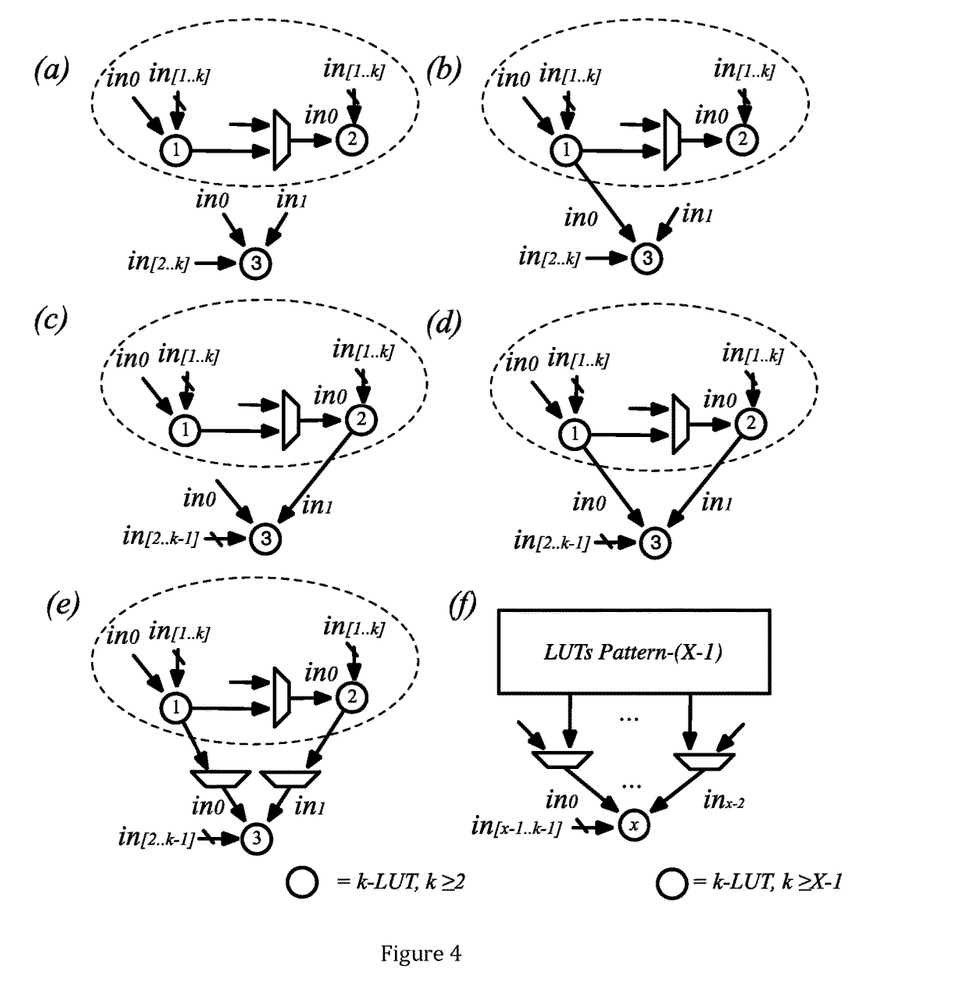
FIG. 4 illustrates all possible interconnection cases between 3 k-LUTs and demonstrates the pattern covering all possibilities.

2) Pattern-3 to Pattern-M: Based on the pattern-2 organization, we can extend the structure to three LUTs (tagged 1, 2 and 3). Referring to FIG. 4, this illustrates all possible combinational interconnections between 3 k-LUTs. FIGS. 4(a) and 4(b) contain 3rd k-LUT that is independent; FIG. 4(c) shows one example of 3rd k-LUT connected to one of the other LUTs; FIG. 4(d) shows 3rd k-LUT that is connected to all the other LUTs; FIG. 4(e) shows an interconnection pattern covering (a)(b)(c)(d); and FIG. 4(f) shows an interconnection pattern of M LUTs. First, FIG. 4(a) shows the case where the inputs of LUT3 are fully independent from LUT1 and LUT2. Then, we can repeat the same reasoning that previously for direct connections between LUTs. FIG. 4(b)(c)(d) list all the possible cases where the inputs of LUT3 are connected to the outputs of LUT1 and LUT2. The cases where the output of LUT3 is connected to the inputs of LUT 1 and LUT2 are not listed but can be regarded as equivalent to FIG. 4(b)(c)(d) by swapping LUT3 with LUT1 or LUT2. Considering all the cases in FIG. 4(a)(b)(c)(d), pattern-3 is proposed in FIG. 4(e).

On a general basis, we can extend the pattern size from 3 to M. Since pattern-(M−1) covers all possible interconnections among (M−1) LUTs, pattern-M can be achieved by adding another LUT (tagged m). The number of inputs of LUT m connected to pattern-(M−1) ranges from 0 to (M−1). Hence, (M−1) 2:1 multiplexer can be added to each input of LUT m as depicted in FIG. 4(f).

B. Pattern-Based Logic Block Design

Figure 5:
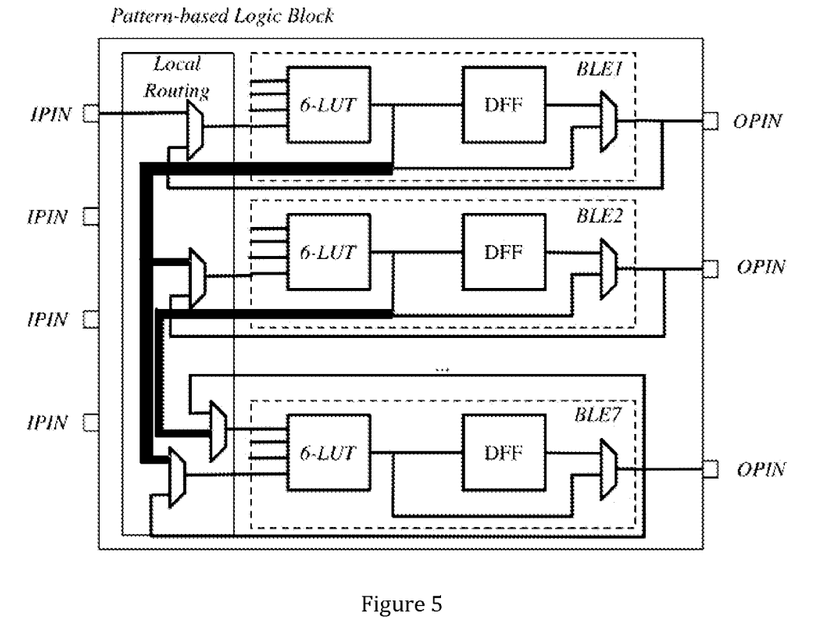
FIG. 5 contains a schematic of a pattern-7 logic block.

To build a logic block based on a pattern-M, the extra 2:1 multiplexers of the patterns can be included (i) in an independent layer between local routing and BLEs, providing ultra-fast shortcuts at the cost of more delay from logic block inputs to LUTs; or (ii) merged into the local routing. In this paper, we study the second case for simplicity. The BLE architecture remains unchanged and we simply feedback the outputs of LUTs to the local routing. The signal feedback increases the size of half of local routing multiplexers by one additional input. Modern FPGA architectures typically use 6-input LUTs in their logic blocks. We therefore employ a pattern-7 organization. The schematic of a pattern-7 logic block is given in FIG. 5. The use of larger multiplexers leads to 0.45% area overhead. The fast combinational interconnections between LUTs are highlighted in thicker lines. Note that a pattern-based logic block can also contain multiple pattern-M. In this paper, we focus only on single pattern logic blocks to evaluate the efficiency of the approach.

IV. Pattern-Based Clustering Algorithm

To support the introduced pattern-based architecture, we develop a new clustering algorithm. While inspired from seed-based algorithms, it aims at attracting patterns rather than single BLEs. A pattern candidate is composed of a seed BLE and its unpacked predecessors. The predecessor selections is bounded by the maximum pattern size available in the cluster.

Our pattern-based algorithm adapts the attraction functions as well as PathAffects identification of AA-Pack. Let lb denotes the logic block, p a pattern and $B_i$ the BLEs involved in the pattern p. As each time we absorb a pattern including a number of $B_i$ BLE candidates. We define the attraction function as the sum of the attraction (1) of each candidate $B_i$.

$$\text{attraction}(lb, p) = \sum_i \text{attraction}(lb, B_i) = \qquad (2)$$
$$\sum_i [\alpha \cdot \text{timing\_criticality}(lb, B_i) + (1 - \alpha) \cdot \text{area\_attraction}(lb, B_i)]$$

Area attraction function is modified to increase the absorption of logic block outputs:

$$\text{area\_attraction}(p, B_i) = \frac{1}{\text{num\_pins}(lb)}[ \qquad (3)$$
$$(1 - \beta) \cdot \text{share\_input\_nets}(lb, B_i) + \beta \cdot \text{absorbed\_output\_nets}(lb, B_i)]$$

where share_input_nets($lb, B_i$) is the number of input nets shared by lb and $B_i$, and absorbed_output_nets denotes the number of output nets of lb absorbed by $B_i$. In our experiments, parameters ($\alpha$, $\beta$)=(0.75, 0.9) yield good performance.

Similarly, we define PathAffects(p) as the average of the PathAffect of each candidate $B_i$:

$$\text{PathAffects}(p) = \frac{\sum \text{PathAffects}(lb, B_i)}{|p|} \qquad (4)$$

and $D_{source}$ of a pattern as the average of the $D_{source}$ of each candidate $B_i$.

$$D_{source}(p) = \frac{\sum D_{source}(lb, B_i)}{|p|} \qquad (5)$$

The pseudo code of the clustering algorithm is shown in Algorithm 1. During the pre-pack stage, additional LUTs are added to those have more combinational outputs than the maximum size of interconnection patterns supported by the logic block. Then, a new empty logic block is instantiated and we select suitable pattern candidate. The patterns are selected according to the maximum size that the current logic block can support. For the example in FIG. 5, if all the BLEs are not yet assigned, the maximum pattern size is 7. Searching from largest pattern size to the lowest, i.e., a single BLE, we select the candidate with the largest attraction (2). Exceptionally for seed pattern, average attraction (2) is used to achieve better routability. If the chosen pattern passes the local router test, the pattern is inserted into logic block. This procedure is iterated until the netlist is mapped.

---
Algorithm 1 Pattern-based clustering algorithm
---
1: prepack: add_LUTs_for_large_fanouts;
2: timing_analysis_with_physical_information;
3: while exist_unpacked_netlist_blocks_do
4:    instanciate_new_logic_block;
5:    while logic_block_not_full||all_patterns_tried do
6:       pattern_size = max_available_pattern;
7:       select_max_pattern_attraction(pattern_size);
8:       if success == local_router then
9:          add_pattern_to_logic_block;
10:      end if
11:    end while
12: end while
---

V. Architectural-Level Simulations

In this section, experimental results are presented. Experimental methodology is first introduced, and followed by the discussion of the results.

A. Methodology

Figure 6:
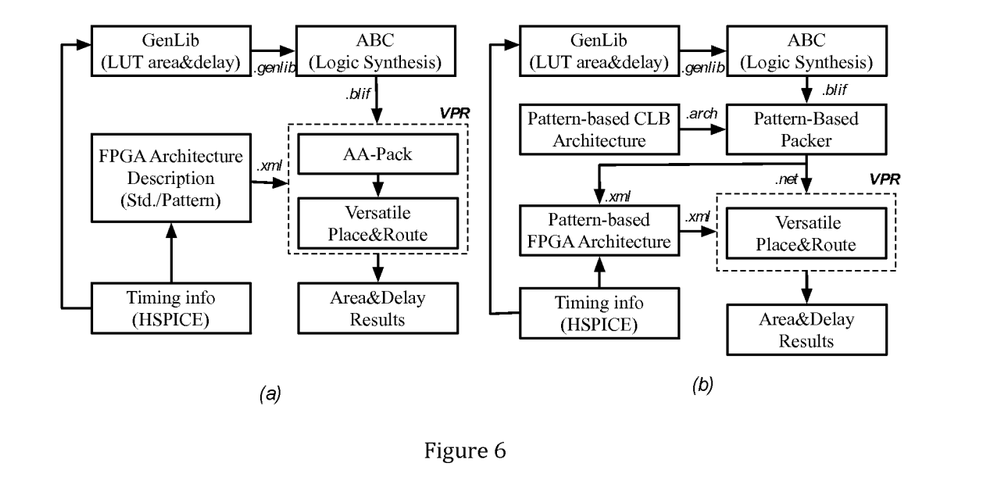
FIG. 6 shows an EDA flow comparison: (a) Standard EDA flow (b) Pattern-based EDA flow.

Modern FPGAs use 6-input LUTs. Therefore, we consider pattern-7 as a reasonable size to investigate the new logic block architecture. Logic block architecture is set as $k=6$, $N=7$, $I=k(N+1)/2=24$. As for routing architecture and physical design parameters, we refer to the Altera Stratix IV GX device at 40-nm technology, available from iFAR [16]. Routing architecture uses single-driver length-4 wires [17], with $F_c(in)=0.15$, $F_c(out)=0.10$. Benchmark set includes the 20 biggest MCNC benchmarks [18], MCNC Finite State Machine (FSM) benchmarks [18] and some OpenCores projects [19]. We evaluate the pattern-based architecture and clustering algorithm by running 3 sets of experiments: 1) the standard CAD flow shown in FIG. 6(a) with a standard baseline architecture to serve as reference; 2) the same standard flow with the novel pattern-based architecture to evaluate the promises of the novel architecture; and 3) the pattern-based CAD flow shown in FIG. 6(b) with pattern-based architecture to evaluate the joint efforts of architecture and clustering algorithm.

All benchmarks pass through logic synthesis by ABC [20]. Then they are packed by pattern-based packer or AA-Pack, and placed and routed by VPR 7 [13].

B. Experimental Results

Table 1 lists the results of the 3 sets of experiments. We first compare the results obtained using the standard flow, then we comment on the new flow.

TABLE 1

Comparison between standard flow and pattern-based flow

| Benchmarks | | | Std. flow, Std. arch. | | | Std. flow, Pattern arch. | | | Pattern-based flow, Pattern arch. | | |
|---|---|---|---|---|---|---|---|---|---|---|---|
| MCNC FSM | LUT No. | DFF No. | Area (# of trans.) | Crit. Delay (ns) | Wire-length | Area (# of trans.) | Crit. Delay (ns) | Wire-length | Area (# of trans.) | Crit. Delay (ns) | Wire-length |
| dk14 | 8 | 3 | 5.23E+04 | 1.30 | 58 | 5.31E+04 | 2.40 | 76 | 5.07E+04 | 1.21 | 54 |
| dk512 | 7 | 4 | 2.54E+04 | 2.49 | 54 | 2.73E+04 | 1.94 | 36 | 2.73E+04 | 2.22 | 46 |
| ex7 | 6 | 5 | 2.71E+04 | 1.05 | 13 | 5.03E+04 | 1.16 | 28 | 2.73E+04 | 0.98 | 9 |
| kirkman | 39 | 4 | 1.60E+05 | 2.46 | 253 | 1.61E+05 | 2.38 | 214 | 1.57E+05 | 2.26 | 239 |
| lion | 3 | 2 | 2.71E+04 | 1.33 | 12 | 2.73E+04 | 1.88 | 20 | 2.73E+04 | 0.78 | 4 |
| mark1 | 29 | 4 | 1.34E+05 | 2.23 | 256 | 1.35E+05 | 1.57 | 192 | 1.35E+05 | 1.86 | 270 |
| mc | 7 | 2 | 2.82E+04 | 1.32 | 37 | 2.75E+04 | 1.88 | 51 | 2.90E+04 | 1.19 | 25 |
| s27 | 4 | 3 | 2.54E+04 | 1.52 | 17 | 2.51E+04 | 1.66 | 20 | 2.55E+04 | 1.05 | 10 |
| Avg. | | | 5.99E+04 | 1.71 | 88 | 6.33E+04 | 1.86 | 80 | 5.99E+04 | 1.44 | 82 |
| MCNC Big20 | LUT No. | DFF No. | Area (# of trans.) | Crit. Delay (ns) | Wire-length | Area (# of trans.) | Crit. Delay (ns) | Wire-length | Area (# of trans.) | Crit. Delay (ns) | Wire-length |
| alu4 | 503 | 0 | 1.87E+06 | 3.72 | 4747 | 1.92E+06 | 4.44 | 4859 | 1.91E+06 | 4.11 | 5062 |
| apex2 | 643 | 0 | 2.52E+06 | 4.32 | 9362 | 2.56E+06 | 4.82 | 9378 | 2.63E+06 | 4.44 | 9335 |
| apex4 | 577 | 0 | 2.41E+06 | 4.17 | 8781 | 2.41E+06 | 4.10 | 8932 | 2.39E+06 | 4.86 | 9123 |
| bigkey | 571 | 224 | 3.21E+06 | 2.15 | 10225 | 3.58E+06 | 2.58 | 10450 | 3.22E+06 | 2.44 | 11500 |
| clma | 2787 | 32 | 1.10E+07 | 6.26 | 43670 | 1.14E+07 | 6.54 | 46458 | 1.13E+07 | 6.79 | 46147 |
| des | 556 | 0 | 3.49E+06 | 3.19 | 15314 | 3.48E+06 | 3.14 | 15353 | 3.58E+06 | 3.56 | 14523 |
| diffeq | 562 | 305 | 2.05E+06 | 4.46 | 5180 | 2.67E+06 | 4.43 | 7823 | 2.08E+06 | 4.41 | 5577 |
| dsip | 681 | 224 | 3.41E+06 | 2.43 | 13729 | 3.37E+06 | 2.45 | 13686 | 3.28E+06 | 2.65 | 13536 |
| elliptic | 315 | 194 | 1.12E+06 | 4.48 | 2349 | 1.84E+06 | 4.25 | 3297 | 1.17E+06 | 4.06 | 2318 |
| ex5p | 354 | 0 | 1.40E+06 | 4.86 | 5294 | 1.44E+06 | 4.17 | 5142 | 1.42E+06 | 3.91 | 5114 |
| ex1010 | 647 | 0 | 2.65E+06 | 3.93 | 9329 | 2.76E+06 | 4.10 | 9551 | 2.73E+06 | 4.08 | 9218 |
| frisc | 1752 | 882 | 7.08E+06 | 8.18 | 31410 | 8.91E+06 | 8.32 | 34203 | 7.07E+06 | 8.36 | 30119 |
| misex3 | 438 | 0 | 1.61E+06 | 4.12 | 4432 | 1.70E+06 | 4.08 | 4911 | 1.65E+06 | 4.66 | 5229 |
| pdc | 1350 | 0 | 5.82E+06 | 5.37 | 25541 | 5.95E+06 | 5.40 | 25672 | 5.83E+06 | 5.79 | 25484 |
| s38417 | 2164 | 1452 | 8.80E+06 | 4.27 | 20465 | 1.14E+07 | 4.48 | 32293 | 9.26E+06 | 4.33 | 28356 |
| s38584.1 | 2093 | 1257 | 8.38E+06 | 4.45 | 25558 | 1.00E+07 | 4.46 | 28537 | 8.55E+06 | 4.48 | 29880 |
| s298 | 18 | 14 | 7.49E+04 | 1.44 | 107 | 1.28E+05 | 1.52 | 163 | 7.54E+04 | 1.45 | 103 |
| seq | 668 | 0 | 2.68E+06 | 3.87 | 9598 | 2.70E+06 | 3.66 | 9622 | 2.71E+06 | 4.00 | 10521 |

TABLE 1-continued

Comparison between standard flow and pattern-based flow

| Benchmarks | | | Std. flow, Std. arch. | | | Std. flow, Pattern arch. | | | Pattern-based flow, Pattern arch. | | |
|---|---|---|---|---|---|---|---|---|---|---|---|
| spla | 1373 | 0 | 6.00E+06 | 5.38 | 25413 | 5.95E+06 | 5.55 | 26469 | 6.09E+06 | 5.72 | 26478 |
| tseng | 657 | 384 | 2.41E+06 | 4.33 | 6061 | 3.40E+06 | 4.33 | 6355 | 2.43E+06 | 4.64 | 6699 |
| Avg. | | | 3.90E+06 | 4.27 | 13828 | 4.38E+06 | 4.34 | 15158 | 3.97E+06 | 4.44 | 14716 |

| Open Cores | LUT No. | DFF No. | Area (# of trans.) | Crit. Delay (ns) | Wire-length | Area (# of trans.) | Crit. Delay (ns) | Wire-length | Area (# of trans.) | Crit. Delay (ns) | Wire-length |
|---|---|---|---|---|---|---|---|---|---|---|---|
| ac97_ctrl | 2790 | 2199 | 1.06E+07 | 3.21 | 27146 | 1.60E+07 | 2.49 | 36252 | 1.06E+07 | 2.60 | 26398 |
| Pci_conf_cyc addr_dec | 26 | 0 | 1.31E+05 | 2.33 | 567 | 1.47E+05 | 1.80 | 426 | 1.47E+05 | 1.77 | 456 |
| Pci_spoci_ctrl | 243 | 60 | 9.23E+05 | 3.79 | 2427 | 9.82E+05 | 3.58 | 2828 | 9.11E+05 | 3.36 | 2425 |
| systemcdes | 503 | 190 | 2.14E+06 | 4.08 | 7191 | 2.36E+06 | 3.66 | 7337 | 2.23E+06 | 3.61 | 7261 |
| Usb_phy | 100 | 98 | 4.84E+05 | 1.84 | 828 | 6.59E+05 | 1.91 | 1150 | 5.09E+05 | 1.41 | 650 |
| Des_perf | 6099 | 8746 | 5.10E+07 | 4.13 | 154738 | 6.81E+07 | 4.09 | 166445 | 5.00E+07 | 3.79 | 138587 |
| Avg. | | | 1.09E+07 | 3.23 | 32150 | 1.47E+07 | 2.93 | 35740 | 1.07E+07 | 2.76 | 29296 |

1) Standard Architecture—Standard Flow vs. Pattern Architecture—Standard Flow: In this comparison, we evaluate the potential of pattern architecture by using standard flow. Table I compares the area, critical delay and wirelength between a standard architecture and the novel pattern architecture using the same CAD flow. In MCNC FSM benchmarks, pattern architecture with standard flow increases area by 5%, critical delay by 5% with a 9% reduction in wirelength, on average. In MCNC big20 benchmarks, pattern architecture consumes additional 9% area, 1% delay and 9% wirelength on average. In OpenCores projects, pattern architecture with standard flow gains a 10% in delay at a cost of 34% area and 11% wirelength overheads. AA-Pack has no preference in taking the advantages of the fast combinational paths in pattern while the additional fanout offered by patterns alters the area attraction [15], and results in performance loss. In OpenCores projects, pattern architecture obtains decent reduction in delay which implies that pattern architecture can instruct AA-Pack to produce better performance even without utilizing the fast combinational paths. In some benchmarks, such as mark1, ac 97ctrl and pci conf cyc addr dec, pattern architecture produces very significant gain in delay and wirelength.

2) Standard Architecture—Standard Flow vs. Pattern Architecture—Pattern Flow: In this comparison, we evaluate the performance of our pattern-based flow. As shown in Table I, we compare the area, critical delay and wirelength between standard flow with standard architecture and pattern-based flow with pattern-based architecture. In MCNC FSM benchmarks, compared to the standard flow in FIG. 6(a), pattern-based flow achieves a 16% delay reduction, a 24% wirelength reduction with only 1% area overhead on average. Most MCNC FSM benchmarks can be packed into less than 10 logic blocks, clearly indicating the strong potential of pattern-based architecture. Taking the example of circuit lion that consists of 3 LUTs, pattern-based flow achieves 40% gain in delay. For MCNC big20 benchmarks, pattern-based flow perform slightly worse than standard, with 1% overhead in area, 4% in delay, and 5% in wirelength on average. In OpenCores projects, pattern-based flow increases 3% area and shrinks 14% in delay and 8% in wirelength on average. Compared to the results gathered with the standard flow, the pattern-based packer reduces the area overhead and increases the gain in delay. Delay improvements are accounted for the fast combinational paths and for the reduction of additional LUTs to accommodate large fanouts. Critical paths of MCNC FSM benchmarks and selected OpenCores projects are shorter compared to MCNC big20, which makes delay gain significant. The limited area loss comes from the pattern-based candidate selection, which tends to group LUTs that are intensively connected to each other instead of simply greedily absorbing the nets. Wirelength gains are accounted for (i) the novel logic block that can absorb more nets, and for (ii) the pattern-based clustering algorithm that packs the circuits with a global optimization instead of local scope on optimality.

VI. Conclusion

In the present description, we investigated the interconnection patterns of LUTs inside standard cluster-based logic blocks and proposed a novel pattern-based logic block architecture. Providing fast combinational path between LUTs, pattern-based logic block generates 0.45% area overhead when LUT size is 6. To take the advantage of fast combinational paths, a pattern-based clustering algorithm is proposed. Experimental results demonstrate that in MCNC FSM benchmarks and OpenCores projects, pattern-based logic block architecture and clustering algorithm contribute to 14% reduction in critical delay and 8% shrink in wirelength with 3% area overhead, on average, compared to standard logic block architecture.

ACKNOWLEDGMENT

This work has been partially supported by the ERC senior grant NanoSys ERC-2009-AdG-246810.

REFERENCES

[1] V. Betz, J. Rose, A. Marquardt, *Architecture and CAD for Deep-Submicron FPGAs*, Kluwer Academic Publishers, 1998.

[2] D. Lewis, V. Betz, D. Jefferson, and et al, *The Stratix TM Routing and Logic Architecture*, ACM/SIGDA International Symposium on FPGAs, 2003, pp. 12-20.s

[3] K. Wang, M. Yang, L. Wang, X. Zhou, and J. Tong, *A Novel Packing Algorithm for Sparse Crossbar FPGA*

*Architectures*, International Conf. on Solid-State and Integrated-Circuit Technology, 2008, pp. 2345-2348.

[4] G. Ni, J. Tong and J. Lai, *A New FPGA Packing Algorithm Based on the Modeling Method for Logic Block*, IEEE International Conf. on ASICs, 2005, pp. 877-880.

[5] E. Ahmed, J. Rose, *The Effect of LUT and Cluster Size on Deep-Submicron FPGA Performance and Density*, IEEE Transactions on Very Large Scale Integration (VLSI) Systems, Vol. 12, No. 3, 2004, pp. 288-298.

[6] V. Betz and J. Rose, *Cluster-Based Logic Blocks for FPGAs: Area-Efficiency vs. Input Sharing and Size*, IEEE Custom Integrated Circuits Conf., 1997, pp. 551-554.

[7] A. Marquardt, V. Betz, and J. Rose, *Using Cluster-Based Logic Blocks and Timing-Driven Packing to Improve FPGA Speed and Density*, ACM/SIGDA International Symp. on FPGAs, 1999, pp. 37-46.

[8] E. Bozorgzadeh, S. Memik, X. Yang, and M. Sarrafzadeh, *Routability-driven Packing: Metrics and Algorithms for Cluster-Based FPGAs*, Journal of Circuits Systems and Computers, Vol. 13, No. 1, 2004, pp. 77-100.

[9] A. Singh, G. Parthasarathy, and M. Marek-Sadowksa, *Efficient Circuit Clustering for Area and Power Reduction in FPGAs*, ACM Trans. on Design Automation of Electronic Systems, Vol. 7, No. 4, 2002, pp. 643-663.

[10] W. Feng, *K-way Partitioning Based Packing for FPGA Logic Blocks without Input Bandwidth Constraint*, Int'l Conf. on Field Programmable Technology, 2012, pp. 8-15.

[11] G. Karypis and V. Kumar, *Multilevel K-Way Hypergraph Partitioning*, DAC, 1999, pp. 343-348.

[12] D. Chen, K. Vorwerk, and A. Kennings, *Improving Timing-Driven FPGA Packing with Physical Information*, International Conf. on Field Programmable Logic and Applications, 2007, pp. 117-123.

[13] J. Rose, J. Luu, C.-W. Yu, O. Densmore, J. Goerders, A. Somerville, K. B. Kent, P. Jamieson and J. Anderson, *The VTR Project: Architecture and CAD for FPGAs from Verilog to Routing*, ACM/SIGDA International Symposium on FPGAs, Feb. 2012, pp. 77-86.

[14] J. Luu, J. Rose, J. Anderson, *Towards Interconnect-Adaptive Packing for FPGAs*, ACM/SIGDA International Symposium on FPGAs, 2014, pp. 21-30.

[15] J. Luu, J. Anderson, and J. Rose, *Architecture Description and Packing for Logic Blocks with Hierarchy, Modes and Complex Interconnect*, ACM/SIGDA International Symposium on FPGA, 2011, pp. 227-236.

[16] Univ. Toronto, *Intelligent FPGA Architecture Repository*, http://www.eecg.toronto.edu/vpr/architectures/

[17] G. Lemieux, E. Lee, M. Tom, A. Yu, *Directional and Single-Driver Wires in FPGA interconnect*, IEEE International Conference on Field Programmable Technology, 2004, pp. 41-48.

[18] S. Yang, *Logic Synthesis and Optimization Benchmarks User Guide Version 3.0*, MCNC, Jan. 1991.

[19] http://www.opencores.org

[20] University of California in Berkeley, ABC: *A System for Squential Synthesis and Verification*, Available online. http://www.eecs.berkeley.edu/~alanmi/abc/

The invention claimed is:

1. A field programmable gate array (FPGA) device having a routing architecture with fast interconnections between Basic Logical Elements of a group of Basic Logical Elements (BLEs), each BLE including a Look-Up Table (LUT), a multiplexer associated with an input of each LUT, the FPGA device comprising:
  a plurality of fast interconnections between different LUTs of the plurality of BLEs, an output of a LUT connecting to an input of a multiplexer of a different LUT to form a fast interconnection of the plurality of fast interconnections, each multiplexer other than a first multiplexer having one input that is connected to an output of a different LUT, a remaining input of the first multiplexer free of the fast interconnections, an output of a last LUT not connected to an input of a multiplexer of any LUT.

2. The FPGA according to claim 1, wherein all inputs of the multiplexers of a LUT other than the first multiplexer are connected to outputs of another LUT by a fast interconnection.

3. The FPGA according to claim 1, wherein the multiplexers are 2:1 multiplexers.

4. The FPGA according to claim 3, further comprising:
  a local routing architecture connected to the group of BLEs,
  wherein another input of the 2:1 multiplexers is connected to an output of the local routing architecture, and
  wherein the 2:1 multiplexers include additional memory bits as an area overhead.

5. The FPGA according to claim 4, wherein
  one of the 2:1 multiplexers includes an additional input, and
  the output of a multiplexer is connected to pre-determined LUT inputs by a fast interconnection.

6. The FPGA according to claim 1, wherein a group of LUTs form a cluster-based logic block.

7. A method of clustering algorithm using the routing architecture of the FPGA of claim 1, which packs the Look-Up Tables (LUTs) of the routing architecture into logic blocks by the method steps of:
  (a) in a pre-pack stage, add additional LUTs working as buffer to the routing architecture for the LUTs whose fanouts are larger than a size of LUT groups;
  (b) instantiating an empty logic block;
  (c) finding candidate groups of LUTs that the logic block is enabled to accommodate;
  (d) selecting a best fit group of LUTs by calculating an attraction of a cost function;
  (e) placing the candidate groups of LUTs identified in the step (c) in a logic block;
  (f) causing a router to check if nets are mapped into the routing architecture, and
    (i) if a net is mapped, run step (c) iteratively until the logic block is full or there is no candidate group, and
    (ii) if a net fails to be mapped, record the failure, run step (c) to try another candidate; and
  (g) when the current logic block is full, starting from step (b) with a new empty logic block, unless all the LUTs are packed.

* * * * *